Sept. 12, 1961 K. H. BECK 2,999,984

SERIES-ENERGIZED CASCADED TRANSISTOR AMPLIFIER

Filed Feb. 13, 1956 2 Sheets-Sheet 1

INVENTOR.
KENNETH H. BECK

BY Arthur H. Swanson
ATTORNEY.

SERIES-ENERGIZED CASCADED TRANSISTOR AMPLIFIER

Filed Feb. 13, 1956 2 Sheets-Sheet 2

INVENTOR.
KENNETH H. BECK
BY Arthur H. Swanson
ATTORNEY.

United States Patent Office 2,999,984

Patented Sept. 12, 1961

2,999,984

SERIES-ENERGIZED CASCADED TRANSISTOR AMPLIFIER

Kenneth H. Beck, Newtown, Pa., assignor to Minneapolis-Honeywell Regulator Company, Minneapolis, Minn., a corporation of Delaware Filed Feb. 13, 1956, Ser. No. 565,056

1 Claim. (Cl. 330—18)

A general object of the present invention is to provide a new and improved electrical signal amplifier. More specifically, the present invention is concerned with an amplifier employing transistors as its amplifying elements.

In the application of transistors to various control circuits it is occasionally desirable to utilize higher voltage excursions than are permitted by the maximum voltage ratings of presently available transistors. In addition, the output power required of a circuit is often greater than can be obtained from a single transistor or from two transistors connected in push pull. In still other circuits, the use of transformers may be undesirable and thus the need arises for other means of combining transistor power outputs.

Accordingly, it is a specific object of the present invention to provide a circuit which permits large output voltage excursions to be obtained without transformation, and which provides a novel means for adding the power outputs of a number of transistors without requiring close matching of their characteristics.

Still another object of the present invention is to provide a new and improved transistor amplifier wherein a number of transistors may be connected in series so that the sum of the voltages across them is applied in series to a common load.

A further object of the present invention is to provide a transistor amplifier comprising a cascade of common base stages with the specific values of external base resistance of each stage determining the contribution of that stage to the load voltage or power.

A still further object of the present invention is to provide a new and improved transistor amplifier in which the emitter-collector voltage of the individual stages can be proportioned in such a manner that each stage contributes equally to the load voltage or contributes equally to the amplifier power output. If desired, each transistor can be made to produce an equal power output.

The various objects of the present invention are achieved in a circuit comprising a plurality of direct coupled common base transistor amplifying stages. The circuit input, the emitter-collector circuit of each of the transistors, and the circuit energizing source are connected in a direct series circuit with the load. The base of each of the transistors is connected by means of a separate resistive network to the circuit energizing source. The resistance of each of these networks is selected with respect to the parameters of the associated transistor, the load resistance, and the stage location to provide for equal contribution by each stage to the load voltage or load power or to provide for an equal power output from each transistor.

The various features of novelty which characterize this invention are pointed out with particularity in the claims annexed to and forming a part of this specification. For a better understanding of the invention, its advantages, and the specific objects attained with its use, reference should be had to the accompanying drawings and descriptive matter in which are illustrated and described preferred embodiments of this invention.

Figure 1:
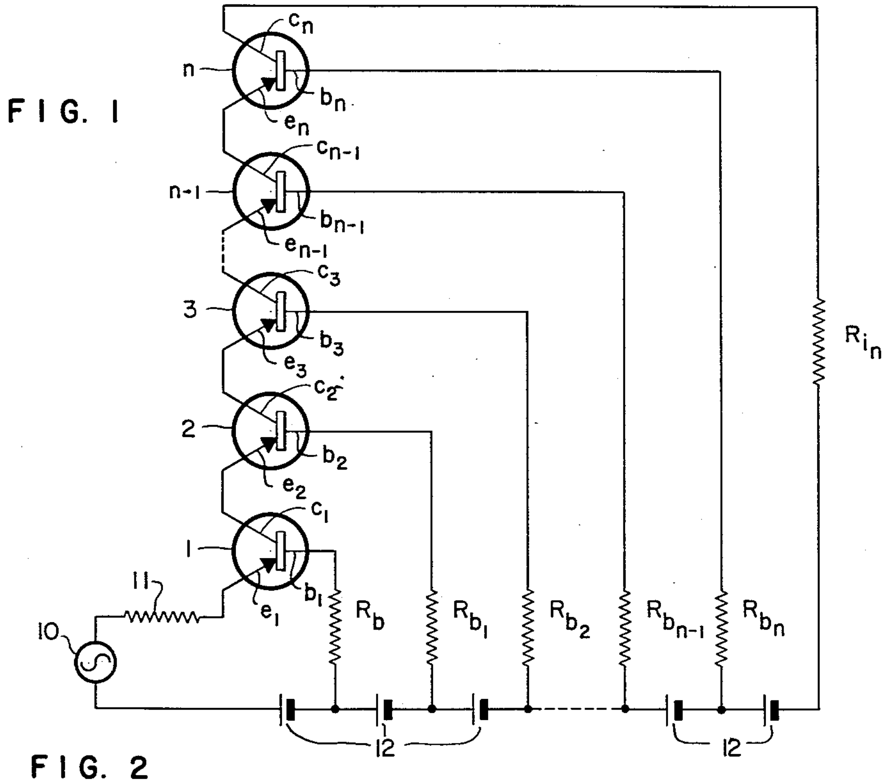
FIG. 1 is a simplified circuit diagram of one embodiment of the present invention.

Referring now to FIG. 1, there is shown a simplified form of the present invention which employs a series of cascaded common base stages. Each of these stages employs as its amplifying element a pnp junction transistor having the usual emitter, collector, and base electrodes. In order to emphasize the broad scope of the present invention, this amplifier has been generally specified as having $n$ number of stages.

The numeral 10 represents a source of alternating current signal having an impedance 11. The source 10 with the source impedance 11 is connected between the positive terminal of a power supply, shown here as a tapped battery 12, and the emitter $e_1$ of the transistor 1 in the first amplifier stage. The base $b_1$ of the transistor 1 is connected by means of the resistor $R_{b_1}$ to a tap on the battery 12. The collector $c_1$ of the transistor 1 is connected directly to the emitter $e_2$ of the transistor 2 in the second amplifier stage. The base $b_2$ of the transistor 2 is connected to a tap on the battery 12 by means of the resistor $R_{b_2}$. The collector $c_2$ of the transistor 2 is connected to the emitter $e_3$ of the transistor 3 in the third amplifier stage. As shown, the emitter-collector circuits of all of the transistors are connected in a direct series circuit, with the collector $c_n$ of the transistor in the $n$th amplifier stage being connected through the load resistor $R_{L_n}$ to the negative terminal of the battery 12. The base $b_3$ of the transistor 3 and the base of the transistor in each of the succeeding amplifier stages are connected through an appropriate resistor to a tap on the battery 12.

It is apparent that in FIG. 1 the sum of the collector to emitter signal voltages of all of the transistors plus the input voltage appears across the load, $R_{L_n}$. It should be noticed, that the base of each transistor is returned to the tap on the power supply through an appropriate resistor. It should also be noticed that the current established at the input terminals will flow along a path including the emitters and collectors of all of the transistors and the load. This current is diminished at each transistor by an amount determined by the transistor current gain. The difference between the emitter current and the collector current is that current which flows from the base.

Figure 2:
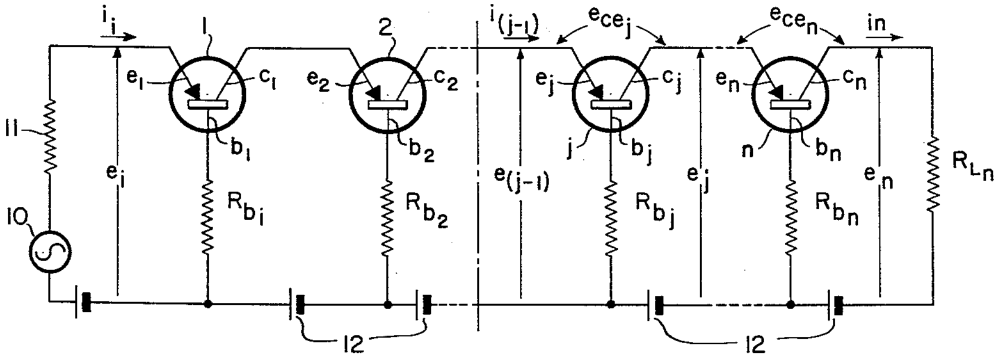
FIG. 2 shows the circuit of FIG. 1 redrawn to emphasize the concept of cascaded stages.

Referring now to FIG. 2 there is shown the circuit of FIG. 1 redrawn to emphasize the concept of cascaded stages. FIG. 2 serves as a basis for defining some of the circuit properties to be discussed. Although much of the explanation that follows is applicable to D.C. conditions of the circuit, the following will be concerned initially with only alternating currents and voltages.

A stage of unspecified location, the *j*th stage, is shown to provide a general definition of terms. The product of the input current and the input resistance to this stage is equal to the input voltage, $e_{(j-1)}$, and the product of the output current of this stage and the input resistance of the next stage is equal to the output voltage, $e_j$. The difference of these two voltages is the transistor voltage, $e_{ce_j}$. It can be seen that the voltage across the *j*th transistor is determined by the ratio of its load to its input resistance for a given current gain. Since the load on the *j*th stage is the input resistance of the $(j+1)$th stage, the design problem of establishing a prescribed division of voltages among the stages amounts to the specification of the input resistance of each stage in terms of the desired distribution of voltage and stage current gains. In deriving design equations for establishing a prescribed division of voltages among the stages of this circuit, the various circuit characteristics will be expressed in terms of the output power, the output voltage, and the load resistance, since it is assumed these quantities will be specified as design objectives, and the small signal parameters of the transistors.

From FIG. 2 it can be seen that the voltage and current levels at the output of the $j$th stage are:

$$e_j = e_i + \sum_{k=1}^{j} e_{ce_k} \tag{1}$$

$$i_j = i_i \prod_{k=1}^{j} a_{i_k} = i_i A_{i_j} \tag{2}$$

Where $a_i$ represents the current gain per stage and $A_{i_j}$ is the total current gain from the input through the $j$th stage.

The power level at the output of the $j$th stage is:

$$P_j = e_j i_j \tag{3}$$

and the power output of the $j$th transistor can be shown to be:

$$P_{oj} = e_{ce_j} i_j \tag{4}$$

Further, it is apparent that the power output of the stage equals the sum of the power input and the transistor power output minus the power loss in the base resistor. This may be expressed:

$$P_j = P_{(j-1)} + P_{oj} - P_{L_j} \tag{5}$$

where $P_{L_j}$ is the lost power in $R_{b_j}$.

The quantity $P_{oj}$ minus $P_{L_j}$ may be regarded as the net power contribution of the $j$th stage to the total output.

Neglecting the small emitter to base voltage drop, the voltage across $R_{b_j}$ may be taken as approximately equal to $e_{(j-1)}$. The base current is equal to the difference between the input and output currents, which are related by $a_{i_j}$, and may therefore be written:

$$i_{b_j} = i_{(j-1)}(1 - a_{i_j}) \tag{6}$$

Therefore $P_{L_j}$ is found from:

$$P_{L_j} = e_{(j-1)} i_{(j-1)} (1 - a_{i_j}) = P_{(j-1)}(1 - a_{i_j}) \tag{7}$$

and Equation 5 becomes:

$$P_j = P_{(j-1)} a_{i_j} + P_{oj} \tag{8}$$

The power gain from the input of the first stage to the output of the $j$th stage is found from Equations 1, 2, and 3 to be:

$$G_j = \frac{e_j i_j}{e_i i_i} = \left(1 + \frac{\sum_{k=1}^{j} e_{ce_k}}{e_i}\right) A_{L_j} \tag{9}$$

The general expression from the input resistance to the $j$th stage in terms of the load resistance may be written from Equations 1 and 2 as:

$$\frac{R_{L_j}}{R_{L_n}} = \frac{\frac{e_{(j-1)}}{i_{(j-1)}}}{\frac{e_n}{i_n}} = \frac{e_i + \sum_{k=1}^{j-1} e_{ce_k}}{e_i + \sum_{k=1}^{n} e_{ce_k}} \cdot \frac{A_{i_n}}{A_{i_{(j-1)}}} \tag{10}$$

or, since $i_n$ equals $$i_{(j-1)} \cdot \prod_{k=j}^{n} a_{i_k}$$

(from 2), the ratio of $R_{i_j}$ to $R_{L_n}$ may also be expressed in the form:

$$\frac{R_{i_j}}{R_{L_n}} = \frac{P_{(j-1)}}{P_n} \prod_{k=j}^{n} a^2_{i_k} = \frac{P_{(j-1)}}{P_n} \cdot \frac{A^2_{i_n}}{A_{i_{(j-1)}}} \tag{11}$$

It can be seen from Equations 10 and 11 that the input resistance to any stage may be expressed in terms of the load resistance, the stage current gains, and another factor determined by the distribution of either voltage or power among the stages.

Figure 3:
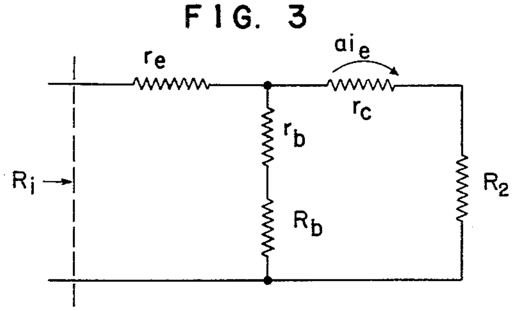
FIG. 3 shows a low frequency, small signal equivalent circuit of a transistor connected in the common base configuration.

Referring for the moment to FIGURE 3, there is shown a low frequency, small signal equivalent circuit of a transistor connected in the common base configuration. If the small internal base resistance, $r_b$, and emitter resistance, $r_e$, are neglected the input resistance to the circuit above is found to be:

$$R_i = R_b \frac{r_c(1-a) + R_L}{R_b + r_c + R_L} \tag{12}$$

where:

$r_c$=dynamic collector resistance
$a$=current amplification factor and the current gain is found to be:

$$a_i = \frac{i_c}{i_e} = \frac{a r_c + R_b}{R_b + r_c + R_L} \tag{13}$$

solving Equation 13 for $R_L$ and substituting this value in Equation 12 the input resistance becomes:

$$R_i = R_b(1 - a_i) \tag{14}$$

or in the general terms used above, $R_{b_j}$ becomes:

$$R_{b_j} = \frac{R_{i_j}}{1 - a_{i_j}} \tag{15}$$

Knowledge of the input resistance to each stage would enable the base resistors to be selected from this relationship.

It is apparent, however, that the stage current gains must be known before $R_{i_j}$ can be determined from either Equation 10 or 11 and before $R_{b_j}$ can be found from the Equation 15. The expression for $R_b$ obtained from Equation 14 may, however, be substituted in Equation 13 and the resulting equation solved for $a_i$. This equation is a quadratic in $a_i$ as shown below:

$$a_i^2(r_c + R_L) - a_i[R_i + R_L + r_c(1+a)] + a r_c + R_i = 0 \tag{16}$$

which has roots:

$$a_i = 1, \frac{a r_c + R_i}{r_c + R_L} \tag{17}$$

From Equation 13 it can be seen that $a_i$ may not have a value of unity except for $a$ greater than 1. Accordingly, the second root will be applicable and in the general terms used above the $j$th stage current gain will be:

$$a_{i_j} = \frac{a_j r_{c_j} + R_{i_j}}{r_{c_j} + R_{L_j}} \tag{18}$$

This expression involves $R_{i_j}$ which cannot be specified from Equation 10 or 11 until all of the stage current gains are known. The term $R_{L_j}$, which also appears in Equation 18 is the load on the $j$th stage and hence the input resistance to the $(j+1)$th stage. Equation 10 may be solved successively for $R_{i_j}$ and $R_{i_{(j+1)}}$ and the ratio of the two solutions used to express the relationship between $R_{i_j}$ and $R_{L_j}$. This is found to be a function of the voltage distribution and the current gain, as below:

$$\frac{R_{i_j}}{R_{L_j}}=\frac{e_{(j-1)}}{e_j}a_{i_j}=\left(1-\frac{e_{ce_j}}{e_j}\right)a_{i_j} \tag{19}$$

or from Equation 11 this ratio may be expressed in terms of the power distribution and current gain as:

$$\frac{R_{i_j}}{R_{L_j}}=\frac{P_{(j-1)}}{P_j}a^2_{i_j} \tag{20}$$

There is an accurate although tedious means for overcoming this interdependence in cases where the specified voltage or power distribution is independent of the stage current gains as it is where there is equal division of voltage or equal power increase per stage. This procedure is as follows. Equation 19 or 20 (depending on whether a voltage or power distribution is specified) may be applied to the $n$th stage to obtain an expression with $R_{i_n}$ and $a_{i_n}$ as the only unknowns (since $R_{L_n}$ is specified) which may then be solved simultaneously with Equation 18 to determine the values of $R_{i_n}$ and $a_{i_n}$. Then, since $R_{i_n}=R_{L(n-1)}$, the process may be repeated for the $(n-1)$th stage and so on back to the first stage.

It has been found, however, that very little error and a significant simplification results if the stage current gains are all taken as equal to the alphas of the transistors when calculating $A_{i_n}$ and $A_{i_{(j-1)}}$ which may be used directly in Equation 10 or 11 to find $R_{L_j}$.

The approximation $a_{i_j}$ equals $\alpha$ may not be sufficiently accurate, however, to apply to Equation 15 for the determination of $R_{b_j}$ since the reciprocal of a very small quantity $1-a_{i_j}$ is involved. A very small difference between $\alpha_j$ and the actual value of $a_{i_j}$ may yield a value of $R_{b_j}$ which is much too large. A better solution for $R_{b_j}$ may be obtained by applying this approximation to the equation below which is obtained by dividing Equation 12 by Equation 13 and solving for $R_b$.

$$R_{b_j}=\frac{\frac{a}{a_{i_j}}r_cR_{i_j}}{r_c(1-a)+R_{L_j}-\frac{R_{i_j}}{a_{i_j}}} \tag{21}$$

From the foregoing it can be seen that the contribution of a particular amplifier stage to the load voltage can be proportioned in a manner desired by appropriately selecting the value of $R_b$ for that stage with respect to the parameters of the transistor employed in the stage and the value of the amplifier load. In Equation 21, the values of $r_c$, $a$, and $\alpha$ can be ascertained from the characteristics of the transistors employed. The amplifier load $R_{L_n}$ and the amplifier signal input voltage $e_i$ would be specified design criteria. The value of $R_{L_j}$ for use in this equation may be determined by substituting the approximate values of $R_{i_j}$ and $a_{i_j}$ in Equation 19 or 20.

Of the many possible ways in which the total output power and voltage may be shared by the individual transistors three representative cases will be treated in some detail. These cases are: (1) equal division of the voltage among all units; (2) equal power increases per stage; and (3) equal power output from each transistor. The analysis for each of these cases will consist of finding expressions for the collector to emitter voltage of each transistor, the total circuit power gain, and the output power of each transistor and the voltage gain. In addition, the design relationships for finding the input resistances and the base resistors will be developed.

Since the maximum voltage ratings of present transistors are fairly low, the equal division of a load voltage among a number of units represents a fairly interesting and practical case. This division can be expressed by:

$$e_n=e_i+ne_{ce_j} \tag{22}$$

The collector to emitter voltages, all being equal, may be related to the input voltage by some constant. Further, since the input may conveniently be supplied by another transistor this constant may be taken as unity for the special case to be considered yielding:

$$e_n=(n+1)e_{ce_j}=(n+1)e_i \tag{23}$$

If it is desired to consider some other ratio, K, between input and transistor voltages, Equation 22 becomes $e_n=(n+K)e_{ce_j}$ which introduces no complications since K will be specified. It should be noted that Equation 23 may be used to determine the number of stages required to realize a desired output voltage with transistors of a given maximum voltage rating.

Since $e_{ce_j}=e_i$ the power gain is found from Equation 9 to be:

$$G_n=(n+1)A_{i_n} \tag{24}$$

and the power output of the $j$th transistor is found from Equations 4 and 24 to be:

$$P_{o_j}=P_iA_{i_j}=\frac{P_n}{n+1}\cdot\frac{A_{i_j}}{A_{i_n}} \tag{25}$$

Equation 10 becomes for case 1:

$$\frac{R_{i_j}}{R_{L_n}}=\frac{j}{n+1}\cdot\frac{A_{i_n}}{A_{i_{(j-1)}}} \tag{26}$$

from which $R_{L_j}$ may be determined by using the $\alpha$'s of the transistors for their current gains.

Equation 19 for case 1 is:

$$\frac{R_{i_j}}{R_{L_j}}=\frac{ja_{i_j}}{j+1} \tag{27}$$

when substituted in Equation 17 yields:

$$a_{i_j}=a_j=\frac{R_{L_j}}{jr_c} \tag{28}$$

which value of $a_{i_j}$ may be used in Equation 15 to find $R_{b_j}$. Such a simple expression for $a_{i_j}$ is not obtained for cases 2 and 3. This accounts for the development of Equation 21 to provide, for these cases, a better approximate solution for $R_{b_j}$ than is afforded by setting $a_{i_j}=\alpha$ in Equation 15. Equation 21 may also, of course, be used for case 1 in which case it takes the form (after substitution of Equation 27):

$$R_{b_j}=\frac{\frac{a_j}{a_{i_j}}r_cR_{i_j}}{r_c(1-a_j)+\frac{R_{i_j}}{ja_{i_j}}} \tag{29}$$

which with the approximation $a_{i_j}=a_j=\alpha_j$ becomes:

$$R_{b_j}\cong\frac{r_cR_{i_j}}{r_c(1-\alpha_j)+\frac{R_{i_j}}{j\alpha_j}} \tag{30}$$

An interesting characteristic of case 1 series circuits is revealed by the consideration of Equation 24. Since $A_{i_n}$ is the product of the individual current gains, all of which are less than unity, it is apparent that each succeeding stage contributes less to the total output. This is also indicated by Equation 25 since the $j$th transistor power output, $P_{o_j}$ varies directly with $A_{i_j}$ which decreases with increasing $j$. To illustrate this point consider the special case which results when all of the stage current gains are equal, in which Equation 24 becomes:

$$G_n=(n+1)a_j^n \tag{31}$$

Differentiating $G_n$ with respect to $n$ in Equation 31:

$$\frac{dG_n}{dn}=a_i^n[1+(n+1)\log_e a_i] \tag{32}$$

When 32 is set equal to zero a maximum is found for a value of $n$ equal to:

(33) $$n_{max}=-\frac{1+\log_e a_i}{\log_e a_i}.$$

A series expansion for $\log_e a_i$ may be written as:

(34)
$$\log_e a_i=-(1-a_i)-\frac{1}{2}(1-a_i)^2-\frac{1}{3}(1-a_i)^3 \ldots -\frac{(1-a_i)^n}{n}$$

Since $1-a_i$ is significantly smaller than unity the series converges rapidly and may be represented to a first approximation by the first term alone. When this term is substituted in 33 the maximum number of stages which may be employed without actually lowering the power gain is found to be:

(35) $$n_{max}\cong\frac{a_i}{1-a_i}$$

which has the same form as the expression for the common emitter current amplification factor $$\beta\cong\frac{a}{1-a}$$

of the transistors. However, $n_{max}$ will generally be smaller than $\beta$ since $a_i$ is always less than $a$.

The decreases in power contribution per stage with increasing number of stages, characteristic of case 1, leads to the consideration of a case wherein the transistor voltages would not all be equal but would increase with increasing stage number as required to maintain a constant power contribution per stage. Since the stage power contribution is simply the difference between the input and output power levels of the stage, it may be represented from Equation 5 by:

(36) $$P_{c_j}=P_j-P_{(j-1)}=P_{o_j}-P_{L_j}$$

and the total output power may be expressed as:

(37) $$P_n=P_i+\sum_{j=1}^{n}P_{c_j}$$

which for the present case becomes:

(38) $$P_n=P_i+nP_{c_j}$$

As the transistor voltages were referred to the input voltage for case 1, so the power contribution per stage may be referred to the input power. Further, if the input power is supplied by another transistor, it might typically be taken as equal to the stage power contribution yielding for the total power output:

(39) $$P_n=(n+1)P_{c_j}=(n+1)P_i$$

As mentioned with reference to the voltage ratio for case 1 some other ratio, K, between the input and contributed power may be treated with no difficulty by writing Equation 39 as:

$$P_n=(n+K)P_{c_j}$$

The power gain of $j$ stages is then seen to be simply $j+1$.

To investigate the required transistor power output and voltages required to maintain the specified stage power level distribution, it is found from Equation 8 that in terms of the input power:

(40) $$P_{o_j}=P_i[1+j(1-a_{i_j})]$$

or in terms of the output power:

(41) $$P_{o_j}=\frac{P_n}{n+1}[1+j(1-a_i)]$$

Substituting 4 in 40 and 41, the transistor voltage can be found in terms of the input or output voltage as:

(42) $$e_{ce_j}=\frac{e_i}{A_{i_j}}[1+j(1-a_{i_j})]=\frac{e_n}{n+1}[1+j(1-a_{i_j})]\frac{A_{i_n}}{A_{i_j}}$$

The power lever at the output of the $j$th stage in terms of the input or the output power is readily found from Equation 39 to be:

(43) $$P_j=(j+1)P_i=\frac{j+1}{n+1}P_n$$

which with Equation 3, gives the voltage level at the output of the $j$th stage in terms of the input or output voltages as:

(44) $$e_j=e_i\frac{j+1}{A_{i_j}}=e_n\frac{j+1}{n+1}\cdot\frac{A_{i_n}}{A_{i_j}}$$

To select the base resistors for case 2 operation, the stage input resistances are first found from the relationship below obtained from Equation 11 (since power distribution is specified which becomes for this case, by substitution of Equation 43:

(45) $$\frac{R_{i_j}}{R_{L_n}}=\frac{j}{n+1}\cdot\frac{A^2_{i_n}}{A^2_{i_{(j-1)}}}=\frac{j}{n+1}\prod_{k=j}^{n}a^2_{i_k}$$

As before, the approximation that the stage current gains are equal to the $\alpha$'s of the transistors may be used.

Equation 20 becomes for case 2:

(46) $$\frac{R_{i_j}}{R_{L_j}}=\frac{j}{j+1}a^2_{i_j}$$

which when substituted in Equation 21 and with the same approximation used for Equation 30 yields:

(47) $$R_{b_j}\cong\frac{r_c R_{i_j}}{r_c(1-\alpha_j)\frac{R_{i_j}}{j\alpha_j^2}[1+j(1-\alpha_j)]}$$

It is seen from Equation 25 that for case 1, the transistor power output falls off with increasing stage number and that from Equation 41 that the transistor power output increases with stage number for case 2. An intermediate case is suggested which would maintain the power output of each transistor equal. As for the other cases, the quantity which is maintained equal for all stages may be related to some input quantity. As in this case, the ratio of the circuit input power to the output power of each transistor may be represented by a constant which will be taken as unity in the following treatment.

The transistor voltages required to maintain this relationship may be found from Equation 4 as follows:

(48) $$e_{ce_j}=\frac{P_{o_j}}{i_j}=\frac{P_i}{i_i A_{i_j}}=\frac{e_i}{A_{i_j}}$$

and from Equation 1:

(49) $$e_n=e_i\left(1+\sum_{j=1}^{n}\frac{1}{A_{i_j}}\right)$$

so the transistor voltages may be expressed in terms of the output voltage as:

(50) $$e_{ce_j}=\frac{e_n}{A_{i_j}\left(1+\sum_{j=1}^{n}\frac{1}{A_{i_j}}\right)}$$

The power gain may be found by substituting Equation 48 in Equation 9 which gives:

(51) $$G_j=A_{i_j}\left(1+\sum_{k=1}^{j}\frac{1}{A_{i_k}}\right)$$

The expression for the input resistance of any stage may be found by substituting Equation 48 in Equation 10 giving:

(52) $$G_j=A_{i_j}\left(1+\sum_{k=1}^{j}\frac{1}{A_{i_k}}\right)$$

from which approximate values of $R_{i_j}$ may be found as for the other cases.

The relationship between the load and the input resistance of the *j*th stage is found by substituting Equation 48 and Equation 49 in Equation 19 giving:

$$\frac{R_{i_j}}{R_{L_j}}=a_{i_j}\left(1-\frac{1}{A_{i_j}\left(1 \sum_{k=1}^{j}\frac{1}{A_{i_k}}\right)}\right) \tag{53}$$

which may be substituted into Equation 21 which becomes:

$$R_{b_j}=\frac{\frac{a_j}{a_{i_j}}r_cR_{i_j}}{r_c(1-a_j)+\frac{R_{i_j}}{a_{i_j}}\cdot\frac{1}{A_{i_j}\left(1+\sum_{k=1}^{j-1}\frac{1}{A_{i_k}}\right)}} \tag{54}$$

to which the approximation used in the other cases, i.e.,: $a_{1j}=a_j=\alpha_j$ may be applied.

The analysis thus far has dealt only with the A.C. signal characteristics of the series circuit. Before practical circuits can be built, attention must be given to the D.C. current and voltage levels so that proper bias conditions may be provided for. A primary difference between the D.C. and low frequency A.C. analysis is the necessity, in the former case, for considering the effect of the collector saturation current, $I_{co}$ of each stage.

Considerable simplification results if the input current to each stage is assumed to be furnished from a constant current supply. If this assumption is made, the $I_{co}$ of each transistor can be considered to flow only in its collector-base circuit and hence will not be amplified (as would occur if it contributed to the emitter-base current). This condition does not strictly prevail even though the output resistance of each stage may be quite high, the design of these circuits may lead to high values for the base resistors. R. F. Shea, in an article entitled, Transistor Operation: Stabilization of Operating Points which appeared in the Proceedings of the I.R.E., volume 40, at page 1435, November, 1952 Issue describes a stability factor, S, which provides a convenient indication of the effective amplication of $I_{co}$ in terms of the total emitter and base resistances. This factor may be written in the form:

$$S=\frac{\partial I_c}{\partial I_{co}}=\frac{R_e+R_b}{R_e+R_b(1-a)} \tag{55}$$

from which it is seen, for example, that if $R_b$ does not exceed the total resistance in the emitter circuit, $R_e$, then the component of collector current due to $I_{co}$ will not be larger than twice $I_{co}$. In other words, the effective amplification of $I_{co}$ will be less than 2.

To calculate the actual $I_{co}$ amplification for any stage it is necessary to know the output resistance of the previous stage (since $Re_j=Ro_{(j-1)}$). The output resistance of the *j*th stage may be found neglecting only the small internal base and emitter resistances from:

$$R_{o_j}=\frac{R_{b_j}}{R_{o_{(j-1)}}+R_{b_j}}\left[r_c(1-a)+R_{o_{(j-1)}}\left(1+\frac{r_c}{R_{b_j}}\right)\right] \tag{56}$$

Since the output resistance of the $(j-1)$th stage is required in Equation 56 the calculations must proceed from the first stage from which $R_{o(j-1)}$ is the (presumably known) resistance of the input generator. Assuming that the $R_{b_j}$'s have been calculated from the appropriate formula for the case of the amplifier being designed, and the $R_{o_j}$'s found from Equation 56, a stability factor from each stage may be determined from Equation 55.

It may be shown that the output current of any stage may be very closely represented in terms of the input current by:

$$I_j=I_i^1\cdot\prod_{k=1}^{j}a_{i_k}+S'_{(j+1)}\cdot I_{co_{(j+1)}}+S_jI_{co_j}+\sum_{k=1}^{j-1}S_kI_{co_k}\prod_{m=k+1}^{j}a_{i_m} \tag{57}$$

where $I'_1$ is the open circuit D.C. voltage of the input generator divided by the sum of the generator resistance and the input resistance of the first stage, and where S' is as given below:

$$S'=\frac{S-1}{a_i} \tag{58}$$

However, if the total D.C. output current, $I_n$, is specified, it can be shown that the output currents of the previous stages may be found approximately by successive application of the equation below from the output stage backwards (i.e., from $j=n$ to $j=1$).

$$I_{j-1}=\frac{I_j}{a_{i_j}}-\frac{I_{co_j}}{a_{i_j}}-\frac{S'_{(j+1)}I_{co_{(j+1)}}}{a_{i_j}} \tag{59}$$

It can also be shown that the base currents may be expressed as:

$$I_b=I_j\left(\frac{1-a_{i_j}}{a_{i_j}}\right)-\frac{I_{co_j}}{a_{i_j}}-\frac{S'_{(j+1)}I_{co_{(j+1)}}}{a_{i_j}} \tag{60}$$

Figure 4:
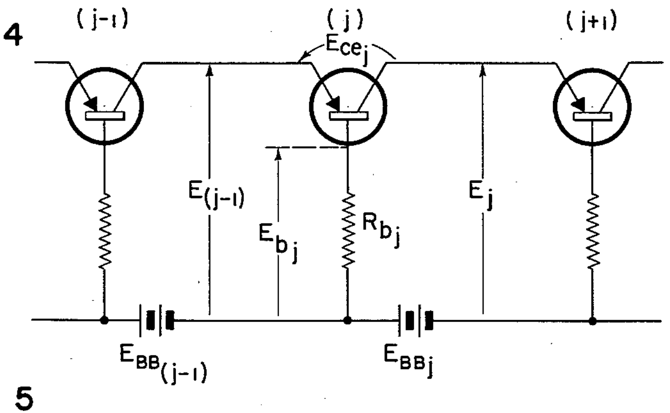
FIG. 4 is a circuit diagram defining *j*th stage D.C. voltage levels.

Knowledge of the D.C. currents in the circuit permits calculation of the D.C. voltages. Referring to FIG. 4, it is apparent that if the small emitter to base voltage drop is neglected:

$$E_{b_j}=E_{(j-1)}=I_{b_j}R_{b_j} \tag{61}$$

Values of $I_{b_j}$ obtained from Equation 60 may be substituted into Equation 61 to determine $E_{b_j}$ for each stage.

Further, from FIG. 4 it can be seen that:

$$E_{ce_j}=E_{(j-1)}-E_j+E_{BB_j} \tag{62}$$

Therefore, $E_{(j-1)}$ and $E_j$ having been found from Equation 61, $E_{ce_j}$ may be made any desired value by appropriate selection of $E_{BB_j}$.

A desired value for $E_{ce_j}$ is, of course, determined by the maximum peak to peak value of the A.C. transistor voltage, $e_{ce_j}$, and the class of bias to be employed. Previous equations have related instantaneous values of $e_{ce_j}$ to $e_1$ or $e_n$ for the three cases. The same relationships of course hold for the peak to peak value so that it is a simple matter to determine what D.C. voltages, $E_{ce_j}$, should be.

Figure 5:
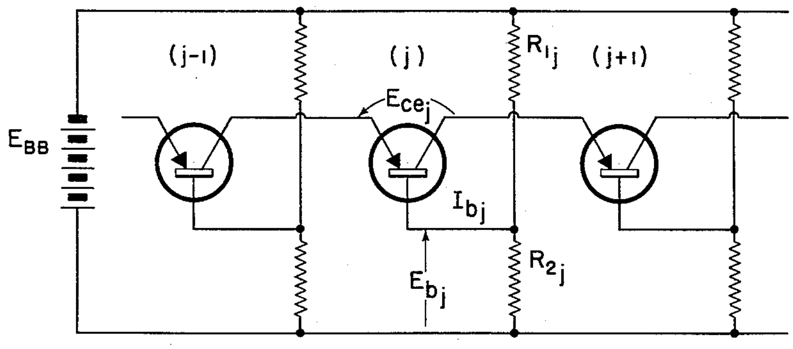
FIG. 5 is a circuit diagram showing the use of voltage dividers to furnish transistor biases from a common untapped power supply.

Generally it will be more convenient to most applications to obtain all of the bias voltages from a single untapped bias supply. This can be done by using a resistor voltage divider to feed each base from the common supply as shown in FIG. 5.

If the desired operating point or quiescent value of the transistor voltages and currents have been determined, the required values of $E_{b_j}$ are readily found in terms of the $E_{ce_j}$'s and $E_{BB}$, the total supply voltage. The design problem then becomes one of specifying $R_{1j}$ and $R_{2j}$. These two in parallel must equal the value of $R_{b_j}$ previously determined to produce the current input resistance $R_{1j}$ for the case of amplifier being designed. In series they must furnish a bleeder current from the power supply which, with $I_{b_j}$, establishes the correct value of $E_{b_j}$. These relationships may be expressed analytically as below. The "*j*" will be dropped in this treatment for simplicity. All that follows will be understood to apply to any stage.

The first requirement for $R_1$ and $R_2$ is:

$$R_b=\frac{R_1R_2}{R_1+R_2} \tag{63}$$

From FIG. 5:

$$E_b=E_{BB}\frac{R_2}{R_1+R_2}-I_b\frac{R_1R_2}{R_1+R_2} \tag{64}$$

Substituting Equation 63 in Equation 64 and solving for $R_1$ and $R_2$:

$$R_1=\frac{E_{BB}R_b}{E_b+I_bR_b} \tag{65}$$

$$R_2=\frac{E_{BB}R_b}{E_{BB}-E_b-I_bR_b} \tag{66}$$

For a class A bias, case 1 amplifier with a resistive load and under the further condition that the D.C. transistor voltages all be equal, the D.C. input voltage (i.e., $E_{ce_j}=E_1$) the expression for $E_{bj}$ which yields the correct D.C. operating voltage can be shown to be:

$$E_{bj}=\frac{jE_{BB}}{2(n+1)} \tag{67}$$

This value may be substituted in Equations 65 and 61 to obtain values for $R_{1_j}$ and $R_{2_j}$.

For cases 2 and 3, the expressions for $E_{bj}$ are not so simple. They involve calculation of $E_{ce_j}$ for each value of $j$ and taking the sum of these voltages between the input and particular stage being considered. The expression for $E_{b_j}$, for all cases under conditions of class A bias and a resistive load, can be shown to be:

$$E_{b_j}=\frac{E_{BB}}{2A_{v_n}}\sum_{k=1}^{j-1}E_{ce_k} \tag{68}$$

where $A_{vn}$ is the expression for the overall voltage gain of the case of amplifier being designed.

From the foregoing it can be seen that the present invention provides novel means for combining the outputs of a number of transistors in a manner which can be determined in accordance with the limitations of the particular transistors employed. The formulas derived herein provide a means for the determination of the external base resistor employed in each stage in accordance with the parameters of the particular transistors utilized and specified design criteria.

Figure 6:
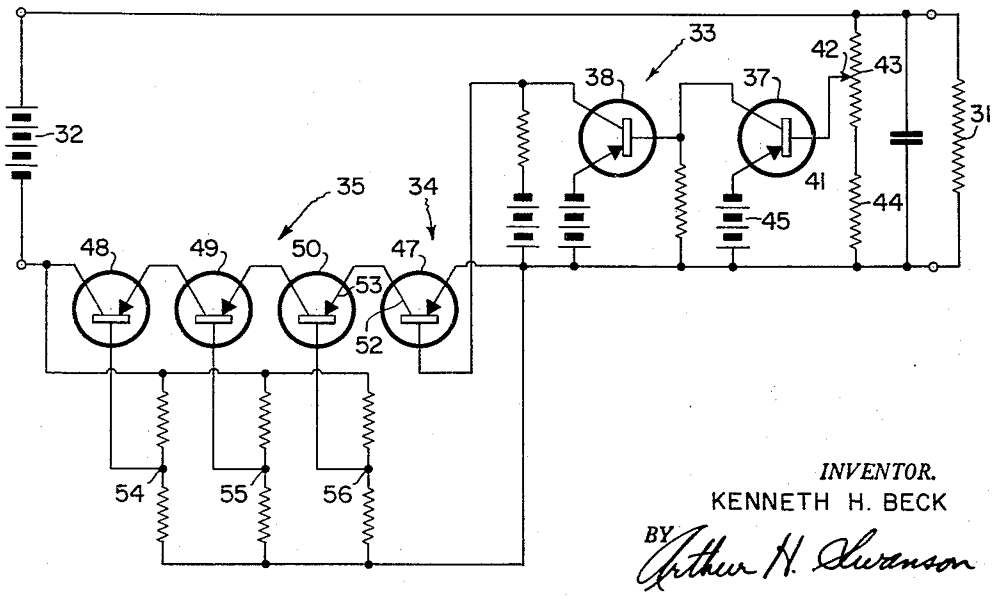
FIG. 6 is a circuit diagram showing a case 1 amplifier utilized in a voltage regulating circuit.

Referring now to FIG. 6, there is shown a circuit diagram of a practical embodiment of the present invention wherein a three stage case 1 amplifier is utilized in a voltage regulated power supply. As shown, the circuit is adapted to regulate the voltage applied across a load 31 by a source of D.C. voltage shown here as the battery 32. The circuit comprises a two stage control amplifier, generally designated 33, a single driver stage, generally designated 34, and a three stage series connected case 1 amplifier connected as the regulating means and generally designated as 35. The control amplifier 33 employs two transistors 37 and 38 connected in a common emitter configuration. The base 41 of the transistor 37 is connected to a sliding contact 42 on a resistor 43. The resistor 43 is part of a voltage divider 44 connected across the load 31. A battery 45 connected in the emitter circuit of the transistor 37 is the reference voltage of the power supply. Accordingly, the adjustment of the sliding contact 42 on the resistor 43 provides means for adjusting the voltage applied by the circuit across the load 31.

The driver 34 employs the transistor 47 connected in the common emitter configuration. The series connected regulating amplifier 35 employs the transistors 48, 49, and 50 connected in a cascaded common base configuration. The collector 52 of the transistor 47 is directly connected to the emitter 53 of the transistor 50 in the first stage of the regulating amplifier 35. As shown, the bases of the transistors 48, 49, and 50 are connected to taps on voltage dividers 54, 55, and 56 respectively.

In the operation of this circuit, any change in the voltage applied between the emitter and base of the transistor 37 due to changes in the voltage delivered to the load is amplified in the control amplifier and applied to the input of the driver stage. The driver, in turn, controls the operation of the regulating amplifier which as a case 1 amplifier is designed to provide equal division of voltage among the stages. Accordingly, the total contribution of this amplifier to the load voltage is increased or decreased as it is necessary to maintain the load voltage constant.

The use of a three stage series connected amplifier as the regulating amplifier instead of a single transistor provides a practical voltage regulator. Accordingly, a substantial voltage can be applied across the load and a comparatively high current can be delivered to the load without excluding the ratings of any of the transistors employed. Obviously, the teachings of the present invention can be applied to other circuits having voltage and power requirements beyond those permitted by the voltage and power ratings of presently available transistors.

While, in accordance with the provisions of the statutes, there have been illustrated and described the best forms of the embodiments of the invention now known, it will be apparent to those skilled in the art that changes may be made in the forms of the apparatus disclosed without departing from the spirit of the invention as set forth in the appended claim and that in some instances certain features of the invention may be used to advantage without a corresponding use of other features.

Having described the present invention, that which is claimed as new and which it is desired to secure by Letters Patent is:

A multi-stage transistor amplifier characterized by its adaptability for operation according to a selected one of a plurality of load voltage and load power sharing modes, comprising a plurality of transistors each having an emitter, a collector and a base, and having a current gain of less than unity, a source of direct current, each of said transistors having a separate resistive signal circuit connecting its base to the source of direct current, an input circuit, a load, and means directly connecting across said direct current source in a direct current series circuit said input circuit, the emitter to collector circuit of all of said transistors, and said load in the order stated, each of said separate resistive signal circuits including a separate pair of series-connected resistors individual to and associated with the corresponding one of said transistors, a connection between the junction of the two resistors in each of said pairs and the base of the corresponding one of said transistors, and means connecting each of said pairs of resistors directly across said direct current source, the resistance of each of said resistors being selectively proportioned with respect to the load and the current gain of the associated transistor to provide operation according to the selected one of said modes.

References Cited in the file of this patent

UNITED STATES PATENTS 1,986,597 Nyman ---------- Jan. 1, 1935
2,032,193 White ---------- Feb. 25, 1936
2,585,078 Barney ---------- Feb. 12, 1952
2,666,817 Raisbeck ---------- Jan. 19, 1954
2,774,826 Moulon ---------- Dec. 18, 1956
2,794,076 Shea ---------- May 28, 1957
2,802,066 Woll ---------- Aug. 6, 1957
2,811,590 Doremus et al. ---------- Oct. 29, 1957
2,835,750 Volkers ---------- May 20, 1958
2,926,307 Ehret ---------- Feb. 23, 1960

FOREIGN PATENTS 559,078 Great Britain ---------- Feb. 3, 1944
717,961 Great Britain ---------- Nov. 3, 1954
729,711 Great Britain ---------- May 11, 1955
740,333 Great Britain ---------- Nov. 9, 1955

OTHER REFERENCES

"L'Onde Electrique," 1949, pages 396–397, FIG. 20, French publication.